(12) United States Patent
Chen et al.

(10) Patent No.: US 11,668,745 B1
(45) Date of Patent: Jun. 6, 2023

(54) PROBE APPARATUS HAVING A TRACK AND WAFER INSPECTION METHOD USING THE SAME

(71) Applicant: NANYA TECHNOLOGY CORPORATION, New Taipei (TW)

(72) Inventors: Yi-Ju Chen, Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/690,133

(22) Filed: Mar. 9, 2022

(51) Int. Cl.
| | | |
|---|---|---|
| G01R 31/26 | (2020.01) | |
| G01R 31/28 | (2006.01) | |
| G01R 1/02 | (2006.01) | |
| G01R 1/04 | (2006.01) | |
| G01R 1/067 | (2006.01) | |
| G01R 1/073 | (2006.01) | |

(52) U.S. Cl.
CPC ..... G01R 31/2887 (2013.01); G01R 31/2891 (2013.01)

(58) Field of Classification Search
CPC ........ G01R 31/02; G01R 31/26; G01R 31/28; G01R 1/02; G01R 1/04; G01R 1/067; G01R 1/073
See application file for complete search history.

(56) References Cited

U.S. PATENT DOCUMENTS

| | | | | |
|---|---|---|---|---|
| 6,970,006 | B2 * | 11/2005 | Appen | G01R 31/2834 324/750.02 |
| 7,119,566 | B2 * | 10/2006 | Kim | G01R 31/2887 324/750.19 |
| 2003/0201764 | A1 * | 10/2003 | Jafari | G01R 31/2886 324/750.23 |

* cited by examiner

*Primary Examiner* — Neel D Shah
(74) *Attorney, Agent, or Firm* — Xuan Zhang (57) ABSTRACT

A probe apparatus and a wafer inspection method are provided. The probe apparatus includes a chuck configured to support a wafer, a track surrounding the chuck, a tester disposed on the track and having a probe, and a processing unit in communication with the tester and configured to move the tester circumferentially around the wafer such that the probe is moved from a first portion on the wafer to a second portion on the wafer.

16 Claims, 6 Drawing Sheets

PROBE APPARATUS HAVING A TRACK AND WAFER INSPECTION METHOD USING THE SAME

TECHNICAL FIELD

The present disclosure relates to a probe apparatus, and more particularly, to a probe apparatus including a track and a wafer inspection method using the probe apparatus.

DISCUSSION OF THE BACKGROUND

Wafer probers are used to test the electrical characteristics of the device under test (DUT) (e.g., integrated circuit (IC) devices) at the wafer level to check whether the DUT satisfies the product specification. To inspect multiple inspection sites or portions on the entire surface of the wafer, the current wafer prober enables the probe to be moved with respect to the wafer along the x-axis, y-axis, and z-axis, and enables the wafer to be moved with respect to the probe along the x-axis and y-axis.

An inspection process may include a series of operations for moving the probe and the wafer to inspect the multiple inspection sites. Therefore, the whole process may be time-consuming. It is desirable to provide a probe apparatus and a wafer inspection method which enable the multiple inspection sites on the entire surface of the wafer to be inspected from many more directions than the current wafer prober.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a probe apparatus. The probe apparatus includes a chuck configured to support a wafer, a track surrounding the chuck, a tester disposed on the track and having a probe. The tester is configured to move around the wafer along a circumferential direction. The probe apparatus also includes a processing unit in communication with the tester and configured to control a movement of the tester.

Another aspect of the present disclosure provides a probe apparatus. The probe apparatus includes a chuck configured to support a wafer, a track surrounding the chuck, and a tester disposed on the track and having a probe. The probe apparatus also includes a processing unit in communication with the tester and configured to move the tester circumferentially around the wafer such that the probe is moved from a first portion on the wafer to a second portion on the wafer.

Another aspect of the present disclosure provides a wafer inspection method. The wafer inspection method includes: moving a probe of a tester along at least one direction with respect to a portion on a wafer and moving the tester circumferentially around the wafer such that the probe is moved from said portion on the wafer to a next portion on the wafer.

By providing the track surrounding the chuck, the tester can be moved around the wafer along a circumferential direction through the track. The probe can be moved with respect to the wafer from many more directions than the current wafer prober, and the flexibility of the probe is increased. Therefore, the entire surface of the wafer can be inspected more quickly.

In addition, since the movement of the tester and/or the probe can be controlled by algorithms or computer-executable instructions, human error can be avoided or minimized.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1:
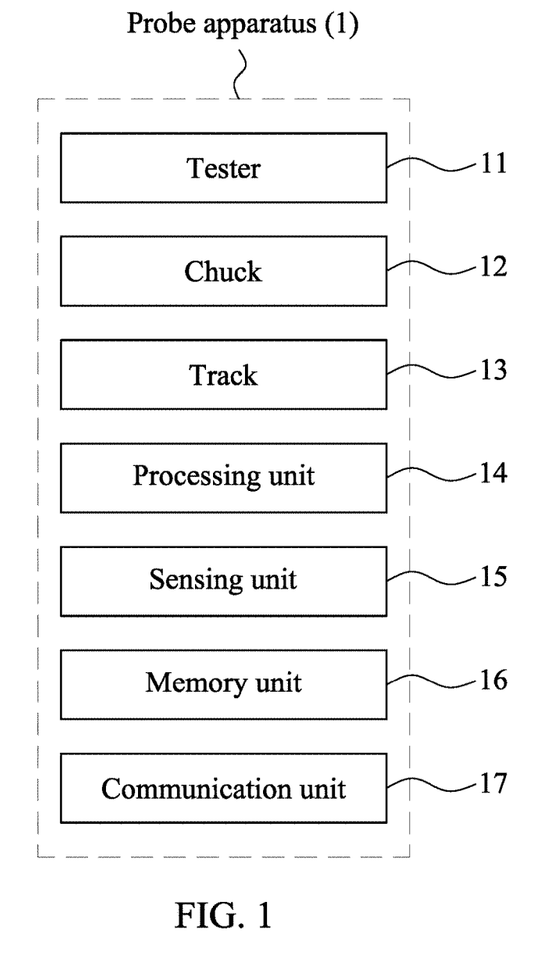
FIG. 1 is a block diagram of a probe apparatus in accordance with some embodiments of the present disclosure.
Figure 2:
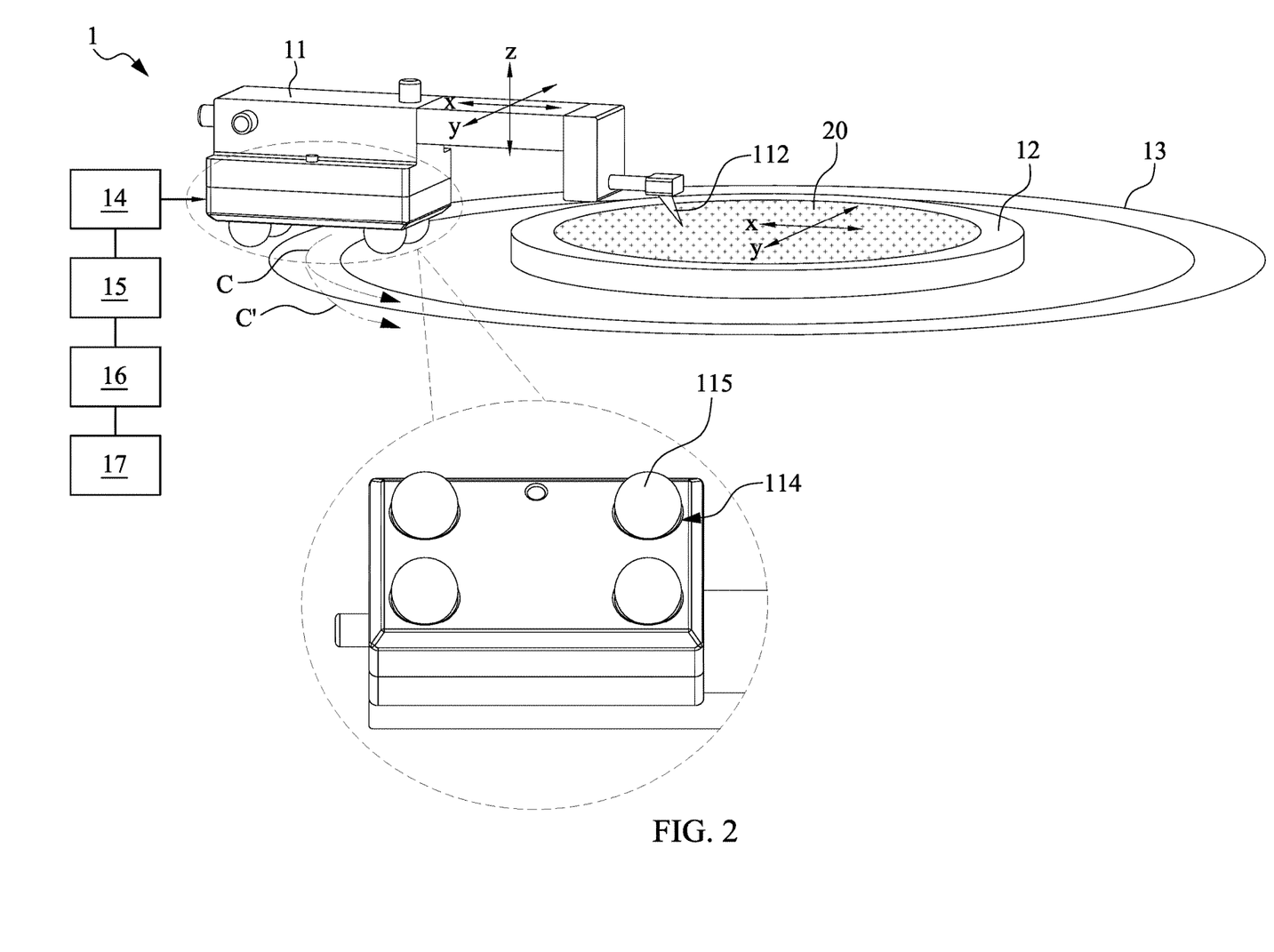
FIG. 2 is a schematic view of a probe apparatus according to some embodiments of the present disclosure.

FIG. 1 is a block diagram of a probe apparatus 1 in accordance with some embodiments of the present disclosure. FIG. 2 is a schematic view of the probe apparatus 1 according to some embodiments of the present disclosure.

The probe apparatus 1 may be used to test the electrical characteristics of the device under test (DUT) (e.g., integrated circuit (IC) devices) at the wafer level to check whether the DUT satisfies the product specification.

Referring to FIG. 1 and FIG. 2, the probe apparatus 1 may include a tester 11, a chuck 12, a track 13, a processing unit 14, a sensing unit 15, a memory unit 16, and a communication unit 17. A wafer 20 may be disposed on the chuck 12.

The tester 11 may be disposed on the track 13. In some embodiments, the tester 11 may include a roller, a wheel, or another object that enables the movement of the tester 11 on the track 13. In some embodiments, the tester 11 may include one or more sockets 114 and one or more balls 115 rotatably held in the one or more sockets 114. In some embodiments, the tester 11 may include a ball joint or a universal joint. For example, the rolling directions of the ball 115 may be universal.

The ball 115 may be engaged with the track 13. The ball 115 may be mounted on the track 13. The track 13 may include a guiding path or a rolling path for rolling the ball 115 and enabling the movement of the tester 11. For example, the tester 11 may be configured to move around the wafer 20 along a circumferential direction "c" through the track 13. In some embodiments, the tester 11 may be configured to move annularly around the wafer 20. For example, the tester 11 may be configured to move along the entire circumference of the wafer 20. In some embodiments, the tester 11 may be configured to move around the wafer 20 in a clockwise direction as shown in FIG. 2. However, in some other embodiments, the tester 11 may be configured to move around the wafer 20 in a counter-clockwise direction.

The tester 11 may be configured to provide an electrical signal to the wafer 20 through a probe 112. In some embodiments, the probe 112 may be configured to move along at least one of the direction "x," the direction "y," and the direction "z" (or the x-axis, the y-axis, and the z-axis) with respect to the wafer 20.

The chuck 12 may be configured to support the wafer 20. In some embodiments, the chuck 12 may be configured to move along at least one of the direction x and the direction y (or the x-axis and the y-axis) so as to move the wafer 20 along at least one of the direction x and the direction y with respect to the probe 112.

In some embodiments, the movement of the tester 11 (such as the movement along the circumferential direction c), the movement of probe 112 (such as the movement along the direction x, the movement along the direction y, and the movement along the direction z), and the movement of chuck 12 (such as the movement along the direction x and the movement along the direction y) may be independent from one another.

For example, the movement of the tester 11, the movement of probe 112, and the movement of chuck 12 may be conducted individually or independently. For example, the movement of the tester 11, the movement of probe 112 and the movement of chuck 12 may be conducted concurrently or respectively as desired. For example, the movement of the tester 11, the movement of probe 112 and the movement of chuck 12 may be conducted consecutively or sequentially as desired. For example, the movement of the tester 11, the movement of probe 112 and the movement of chuck 12 may be controlled by the processing unit 14 separately.

The track 13 may surround the chuck 12 and the wafer 20 on the chuck 12. In some embodiments, the track 13 may define a rolling path for the ball 115. In some embodiments, the track 13 may define the circumferential direction c for the movement of the tester 11.

The processing unit 14 may be in communication with the tester 11, the probe 112, and/or the chuck 12. The processing unit 14 may control the movement of the tester 11, the movement of the probe 112, and/or the movement of the chuck 12.

In some embodiments, the processing unit 14 may control the movement of the tester 11, the movement of the probe 112, and/or the movement of the chuck 12 independently, individually, or separately. For example, the processing unit 14 may control the movement of the tester 11, the movement of probe 112, and/or the movement of chuck 12 concurrently or consecutively as desired.

The processing unit 14 may be configured to conduct a wafer inspection process of the present disclosure. For example, the processing unit 14 may be configured to move the tester 11, the probe 112, and/or the chuck 12 to inspect multiple inspection sites or portions on the entire surface of the wafer 20.

The processing unit 14 may be configured to execute algorithms or computer-executable instructions stored in a memory such as the memory unit 16 or another medium. For example, the processing unit 14 may be configured to cause a series of operational steps to be performed on the probe apparatus 1 or other programmable apparatuses to produce a computer implemented process such that the instructions provide processes for implementing the operations specified in the flow charts (described with respect to FIG. 4).

In some embodiments, the processing unit 14 may include (or may be) a processor (e.g., a central processing unit (CPU), a graphic processing unit (GPU), a micro processing unit (MCU), an application specific integrated circuit (ASIC) or the like) or a controller.

The sensing unit 15 may be in communication with the processing unit 14. In some embodiments, the sensing unit 15 may also be in communication with the tester 11, the probe 112, and/or the chuck 12. In some embodiments, the sensing unit 15 may be configured to detect whether the tester 11 is offset from the circumferential direction c. For example, the sensing unit 15 may be configured to detect a shift, a tilt, a rotation, or other movement of the tester 11. For example, the sensing unit 15 may be configured to detect movement of the tester 11 with respect to the track 13, the chuck 12, and/or the wafer 20.

In some embodiments, the sensing unit 15 may be configured to measure an offset direction "c'" of the tester 11 with respect to the circumferential direction c. For example, the circumferential direction c is the predetermined or the required moving direction of the tester 11. For example, the offset direction c' is the moving direction of the tester 11 offset from the circumferential direction c.

For example, the sensing unit 15 may be configured to measure an offset angle of the tester 11 with respect to the circumferential direction c. For example, the sensing unit 15 may be configured to measure an offset distance of the tester 11 with respect to the circumferential direction c.

In some embodiments, the sensing unit 15 may be configured transmit the detecting result (including the offset direction c') to the processing unit 14 through the communication unit 17. In some embodiments, the processing unit 14 may be configured to receive the detecting result (including the offset direction c') and then adjust the movement of the tester 11 based on the detecting result (including the offset direction c'). For example, the processing unit 14 may be configured to adjust the moving direction, angle, distance of the tester 11.

In some embodiments, the sensing unit 15 may include a rangefinder, a LiDAR, or another sensor configured to detect information about an environment of the tester 11 and output the information.

The memory unit 16 may be configured to store algorithms or computer-executable instructions of the processing unit 14. The memory unit 16 may also be configured to store data, such as the trajectory of the tester 11, the probe 112, and/or the chuck 12. The memory unit 16 may also be configured to store the detecting result of the sensing unit 15.

In some embodiments, the memory unit 16 may include random access memory (RAM), read only memory (ROM), hard drives, as well as removable memory devices, which can include memory sticks, memory cards, flash drives, external hard drives, and so on.

The communication unit 17 may be configured to send/receive data to/from the probe apparatus 1 via wired or wireless techniques (e.g., Wi-Fi, cellular networks, Bluetooth, or the like). In some embodiments, the communication unit 17 may include a wireless communication transceiver. For example, the communication unit 17 may include a transmitter, a receiver, an antenna, and so on.

Although there are seven units in the probe apparatus 1, the present disclosure is not limited thereto. For example, in some embodiments, there may be any number of units in the probe apparatus 1. In addition, in some embodiments, the probe apparatus 1 may also interact with other hardware and/or software components not depicted in FIG. 1 and FIG. 2. For example, the probe apparatus 1 may interact with one or more external user interface devices, such as a keyboard, a mouse, a display monitor, a touchscreen, etc.

The present disclosure may be embodied as a system, method, computer program or any combination thereof. Accordingly, the present disclosure may take the form of an entirely hardware embodiment, an entirely software embodiment (including firmware, resident software, micro-code, etc.) or an embodiment combining software and hardware aspects that may all generally be referred to herein as a "unit," "module" or "system." Furthermore, the present disclosure may take the form of a computer program embodied in any tangible medium of expression having computer usable program code embodied in the medium.

The present disclosure may be described in the general context of algorithms or computer-executable instructions, such as programs, being executed by a computer. Generally, programs include routines, programs, objects, components, data structures, etc., that perform particular tasks or implement particular abstract data types. The present disclosure may also be practiced in distributed computing environments where tasks are performed by remote processing devices that are linked through a communications network. In a distributed computing environment, programs may be located in both local and remote computer storage media including memory storage devices.

Figure 3:
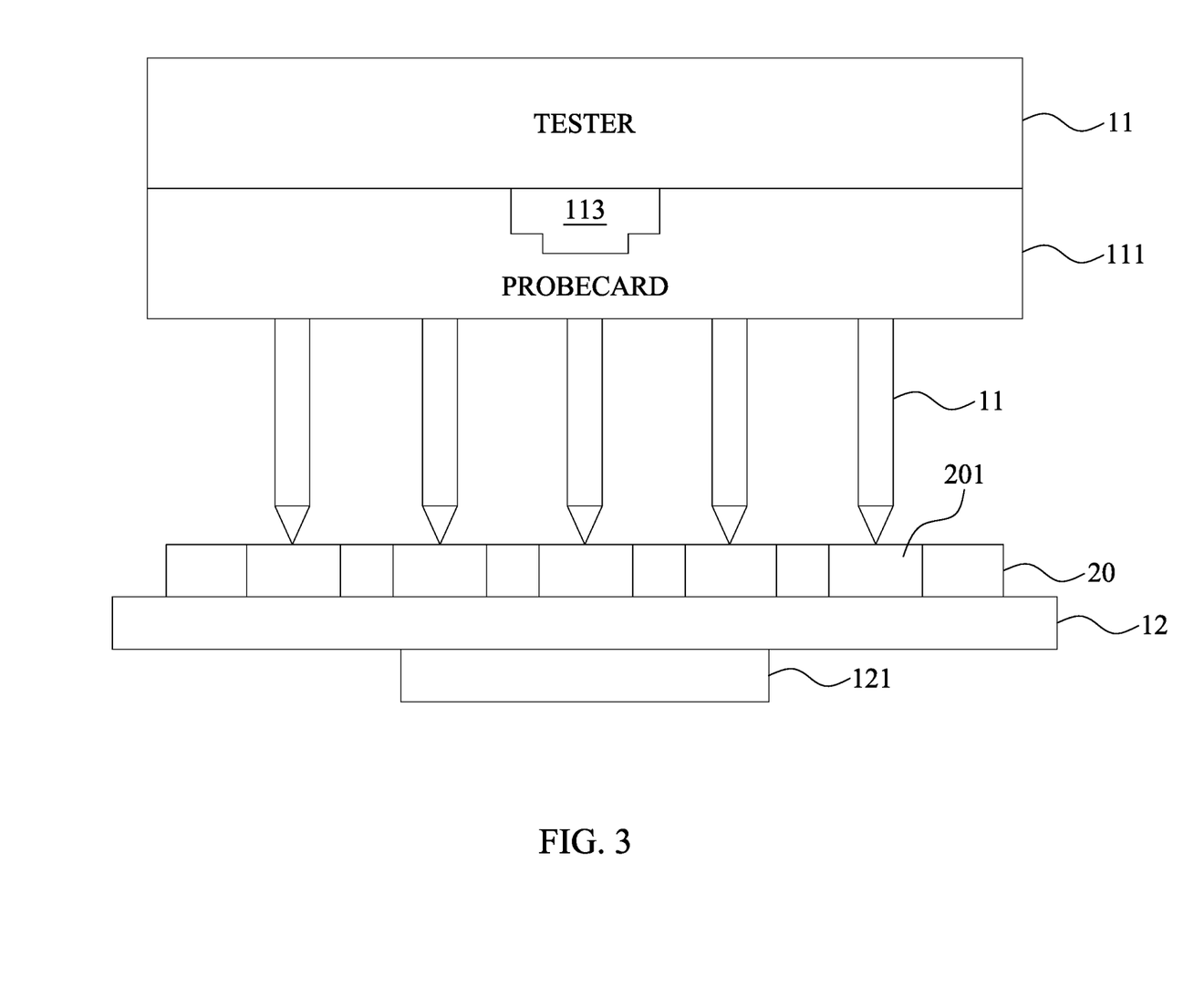
FIG. 3 is a schematic view of a part of a probe apparatus according to some embodiments of the present disclosure.

FIG. 3 is a schematic view of a part of a probe apparatus according to some embodiments of the present disclosure. In some embodiments, the tester 11 in FIG. 3 may be a part of the probe apparatus 1 in FIG. 2.

In some embodiments, the tester 11 may include a probe card 111, the one or more probes (or probe pins) 112, and a camera 113.

A DUT of the wafer 20 may be disposed under the tester 11. The wafer 20 may be disposed on the chuck 12. The chuck 12 may include a regulator 121 for moving the chuck 12 and to enable the movement of chuck 12 (such as the movement along the direction x and the movement along the direction y shown in FIG. 2).

The tester 11 may provide an electrical signal to test the DUT of the wafer 20. The electrical signal may be transferred to the DUT by contacting one or more pads (or testing pads) 201 on the DUT of the wafer 20 with the one or more probes 112. The camera 113 may capture an image of the DUT after the pads 201 have been contacted by the probes 112.

The number of the probes 112 may be adjusted based on requirements and is not limited to the present disclosure.

The camera 113 may be configured to capture an image of the DUT of the wafer 20. In some embodiments, the camera 113 may be configured to capture an image of the DUT of the wafer 20 during the wafer inspection process of the present disclosure. In some embodiments, the camera 113 may be configured to capture an image of the DUT of the wafer 20 in situ.

In some embodiments, the camera 113 may include one or more lenses (such as objective lens, zoom lens, relay lens, imaging lens, condensing lens, etc.), one or more light sources (such as a low-power light source, an external light source, a near-infrared light source, etc.), a charge-coupled device (CCD), a complementary metal-oxide semiconductor (CMOS) imaging sensor, or one or more signal converters (such as an analog-to-digital (A/D) converter). In some embodiments, the camera 113 may be omitted.

The DUT of the wafer 20 may be a die that has completed front-end fabrication. The wafer 20 may include a plurality of DUTs.

In some embodiments of the present disclosure, in addition to the wafer 20, another kind of DUT may be disposed under the tester 11 to undergo a process for testing electrical characteristics. The examples of DUTs are a semiconductor package, a semiconductor substrate, a circuit, a memory cell (such as a dynamic random access memory cell (DRAM cell)), etc. The system and method of the present disclosure can be applied for any DUT in order to test the electrical characteristics.

Figure 4:
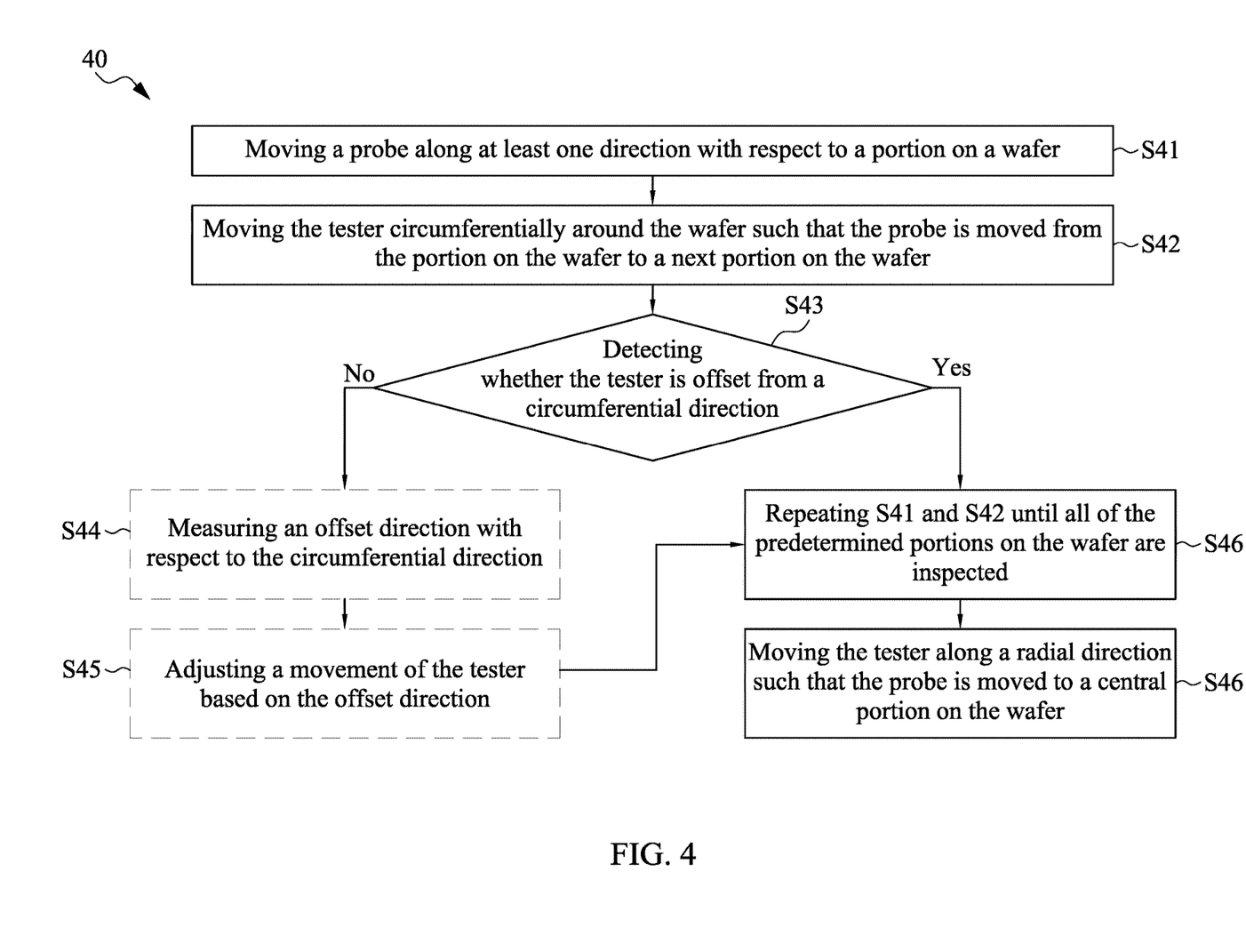
FIG. 4 illustrates a flow chart of a wafer inspection method in accordance with some embodiments of the present disclosure.

FIG. 4 illustrates a flow chart of a wafer inspection method 40 in accordance with some embodiments of the present disclosure.

The wafer inspection method 40 can be conducted by the processing unit 14.

The step or operation S41 is moving a probe along at least one direction with respect to a portion on a wafer.

Figure 5:
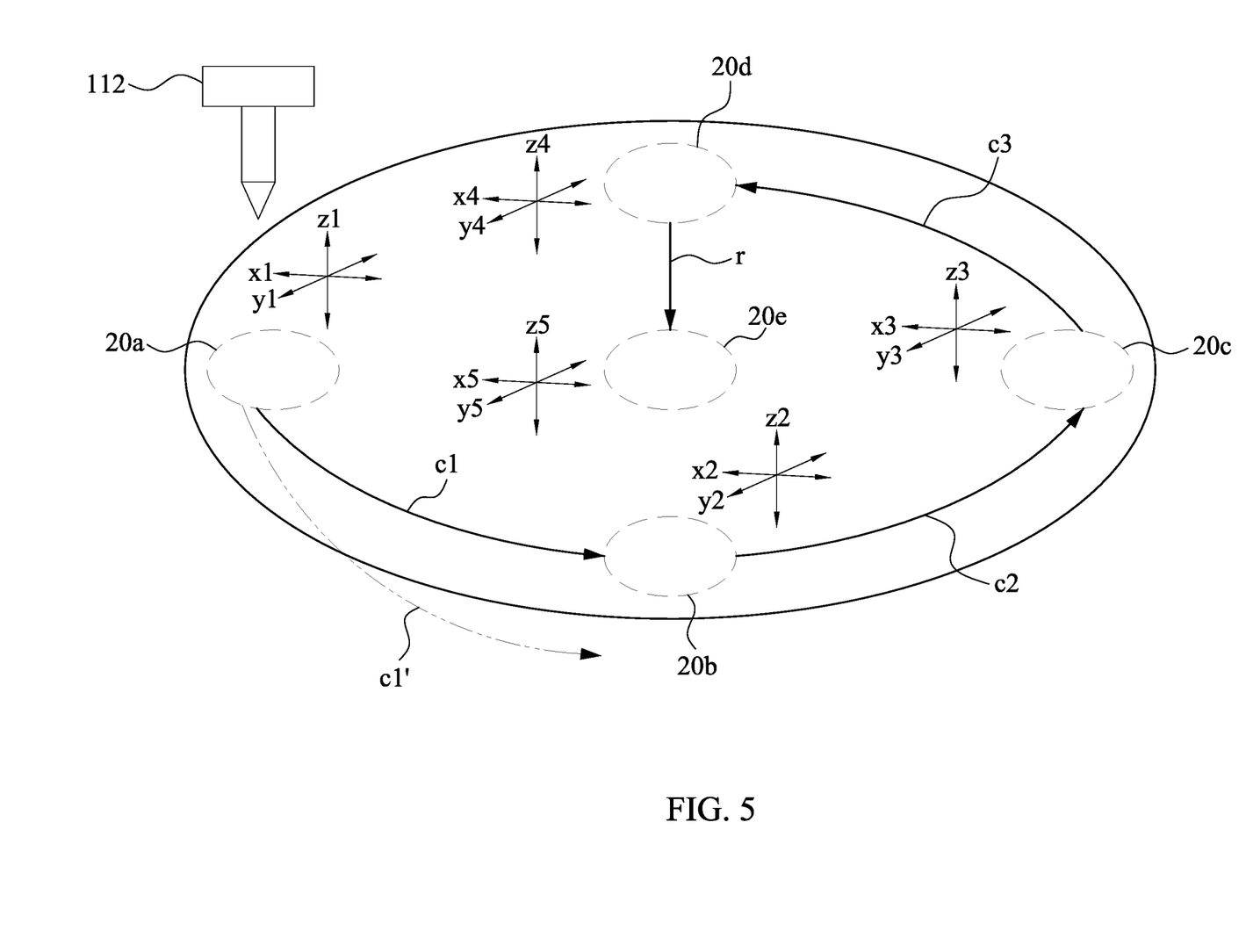
FIG. 5 is a schematic view of a wafer according to some embodiments of the present disclosure.

For example, as shown in FIG. 5, the sites or the portions 20a, 20b, 20c, 20d, and 20e on the wafer 20 represent the predetermined portions to be inspected or detected by the probe 112. On the portion 20a, the probe 112 may be moved along at least one of the direction "x1," the direction "y1," and the direction "z1" (or the x-axis, the y-axis, and the z-axis) with respect to the portion 20a of the wafer 20. In some embodiments, the movements of the probe 112 may be controlled by a processing unit (such as the processing unit 14 in FIG. 2).

The step or operation S42 is moving the tester circumferentially around the wafer such that the probe is moved from one portion on the wafer to a next portion on the wafer.

For example, as shown in FIG. 5, the tester (such as the tester 11 in FIG. 2) is moved (along the track 13 in FIG. 2) circumferentially around the wafer 20. Therefore, the probe 112 of the tester is moved from the portion 20a to the portion 20b along the circumferential direction c1. In some embodiments, the movements of the tester may be controlled by a processing unit (such as the processing unit 14 in FIG. 2).

The step or operation S43 is detecting whether the tester is offset from a circumferential direction.

For example, a sensing unit (such as the sensing unit 15 in FIG. 2) may be configured to detect a shift, a tilt, a rotation, or other movement of the tester 11. For example, the sensing unit may be configured to detect movement of the tester 11 with respect to the track 13, the chuck 12, and/or the wafer 20 shown in FIG. 2.

If it is detected that the tester is offset from a circumferential direction (such as the circumferential direction c1), the wafer inspection method 40 proceeds to the step or operation S44, measuring an offset direction with respect to the circumferential direction.

For example, as shown in FIG. 5, a sensing unit (such as the sensing unit 15 in FIG. 2) may be configured to measure an offset direction c1' of the tester 11 with respect to the circumferential direction c1.

Then, the wafer inspection method 40 proceeds to the step or operation S45, adjusting a movement of the tester based on the offset direction.

For example, the sensing unit may be configured to transmit the detecting result (including the offset direction c1') to the processing unit 14 through a communication unit (such as the communication unit 17 in FIG. 2). The processing unit 14 may be configured to receive the detecting result (including the offset direction c1') and then adjust the movement of the tester 11 based on the detecting result (including the offset direction c1'). For example, the processing unit 14 may be configured to adjust the moving direction, angle, distance of the tester 11.

If it is detected that the tester is offset from a circumferential direction (such as the circumferential direction c1), the wafer inspection method 40 proceeds to the step or operation S46, repeating S41 and S42 until all of the predetermined portions on the wafer are inspected.

For example, as shown in FIG. 5, on the portion 20b, the probe 112 may be moved along at least one of the direction "x2," the direction "y2," and the direction "z2" (or the x-axis, the y-axis, and the z-axis) with respect to the portion 20b of the wafer 20. Then, the tester (such as the tester 11 in FIG. 2) is moved (along the track 13 in FIG. 2) circumferentially around the wafer 20. Therefore, the probe 112 of the tester is moved from the portion 20b to the portion 20c along the circumferential direction c2.

On the portion 20c, the probe 112 may be moved along at least one of the direction "x3," the direction "y3," and the direction "z3" (or the x-axis, the y-axis, and the z-axis) with respect to the portion 20c of the wafer 20. Then, the tester (such as the tester 11 in FIG. 2) is moved (along the track 13 in FIG. 2) circumferentially around the wafer 20. Therefore, the probe 112 of the tester is moved from the portion 20c to the portion 20d along the circumferential direction c3.

On the portion 20d, the probe 112 may be moved along at least one of the direction "x4," the direction "y4," and the direction "z4" (or the x-axis, the y-axis, and the z-axis) with respect to the portion 20d of the wafer 20.

In some embodiments, the probe 112 may be configured to move around the wafer 20 in a clockwise direction. The portions 20a, 20b, 20c, and 20d are inspected or tested sequentially. In some other embodiments, the probe 112 may be configured to move around the wafer 20 in a counter-clockwise direction. The portions 20d, 20c, 20b, and 20a are inspected or tested sequentially.

In some embodiments, the portions 20a, 20b, 20c, and 20d may be inspected or tested in an interval manner. For example, the order of the portions may be different from the above order and can be adjusted as desired.

There may be any number of predetermined portions on the wafer 20. After the all of the predetermined portions on the wafer 20 are inspected, the wafer inspection method 40 proceeds to the step or operation S47, moving the tester along a radial direction such that the probe is moved to a central portion on the wafer.

For example, as shown in FIG. 5, the tester (such as the tester 11 in FIG. 2) is moved along a radial direction r of the wafer 20. Therefore, the probe 112 of the tester is moved from the portion 20d to a central portion 20e along the radial direction r.

On the central portion 20e, the probe 112 may be moved along at least one of the direction "x5," the direction "y5," and the direction "z5" (or the x-axis, the y-axis, and the z-axis) with respect to the central portion 20e of the wafer 20.

In some embodiments, the central portion 20e may be inspected or tested between any two of the portions 20a, 20b, 20c, and 20d.

According to some embodiments of the present disclosure, providing the track 13 surrounding the chuck 12, the tester 11 can be moved around the wafer 20 along a circumferential direction (such as the circumferential directions c, c1, c2, and c3) through the track 13. The probe 112 can be moved with respect to the wafer 20 from many more directions than the current wafer prober, and the flexibility of the probe 112 is increased. Therefore, the entire surface of the wafer 20 can be inspected more quickly.

In addition, since the movement of the tester 11 and/or the probe 112 can be controlled by algorithms or computer-executable instructions, human error can be avoided or minimized.

Any reference in the specification to a method should be applied mutatis mutandis to a system capable of executing the method. Any reference in the specification to a system should be applied mutatis mutandis to a method that may be executed by the system.

Figure 6:
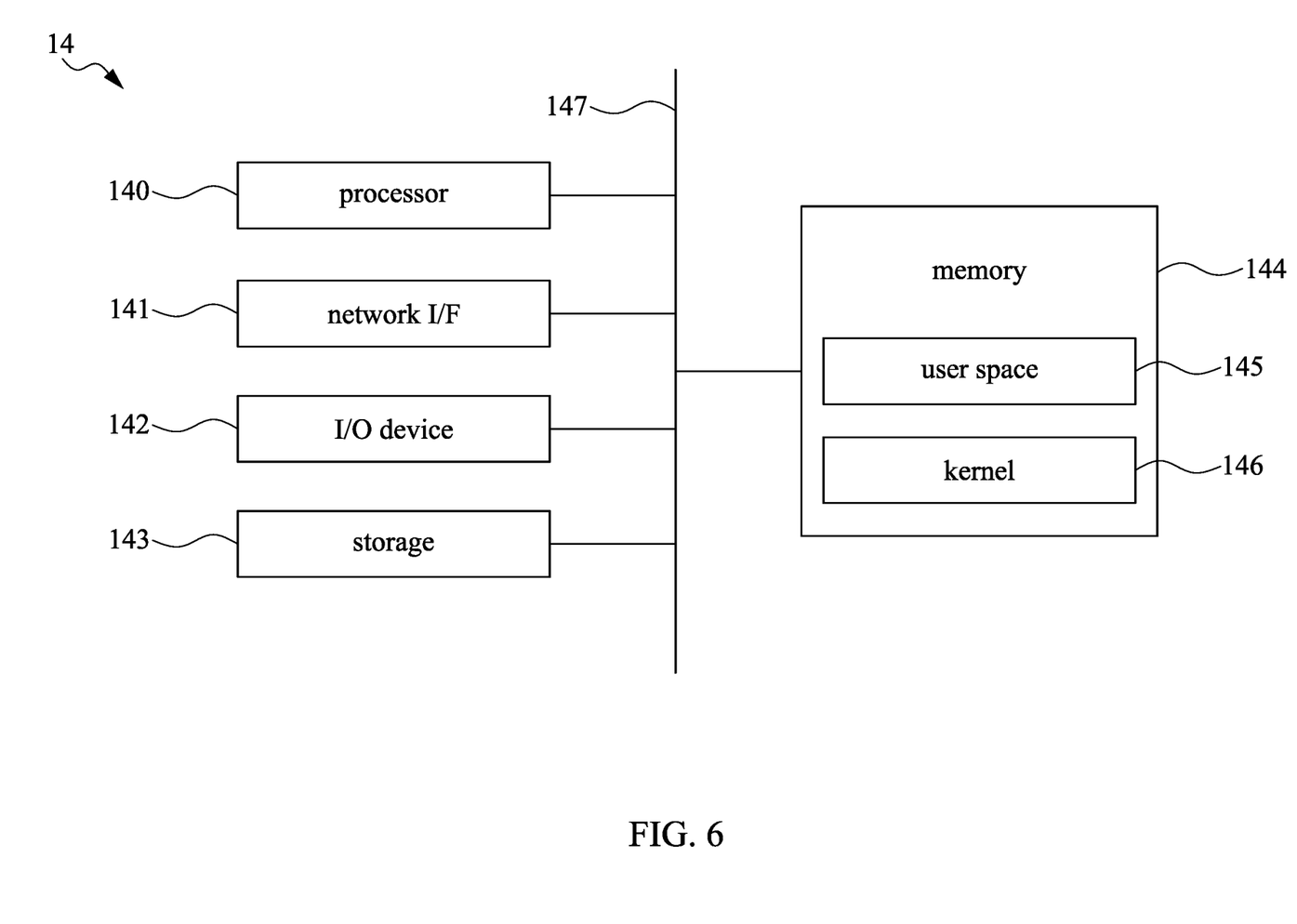
FIG. 6 is a block diagram of a processing unit of a probe apparatus in accordance with some embodiments of the present disclosure.

FIG. 6 is a block diagram of the processing unit 14 of the probe apparatus 1 in accordance with some embodiments of the present disclosure.

The processing unit 14 may include a processor 140, a network interface (I/F) 141, an input/output (I/O) device 142, a storage 143, and a memory 144 communicatively coupled via a bus 147 or another interconnection communication mechanism.

In some embodiments, one or more operations or functionalities of the probe apparatus 1 are realized by the processor 140, which is programmed for performing such operations and functionalities. One or more of the I/F 141, the I/O device 142, the storage 143, and the memory 144 are operable to receive instructions, data, design rules, netlists, layouts, models and other parameters for processing by the processor 140.

The I/F 141 may be coupled to the bus 147 to connect the processor 140 to the Internet.

The I/O device 142 may include an input device, an output device, or a combined input/output device for enabling user interaction with the probe apparatus 1. An input device comprises, for example, a keyboard, keypad, mouse, trackball, trackpad, or cursor direction keys for communicating information and commands to the processor 140. An output device includes, for example, a display, a printer, a voice synthesizer, etc., for communicating information to a user.

The storage device 143, such as a magnetic disk or optical disk, may be coupled to the bus 147 for storing data or instructions.

The memory 144 may include RAM, ROM, hard drives, as well as removable memory devices, which can include memory sticks, memory cards, flash drives, external hard drives, and so on. The memory 144 may include a kernel 145 and a user space 146. The memory 144 may be coupled to the bus 147 for storing data or instructions to be executed by the processor 140. The memory 144 may also be used, in some embodiments, for storing temporary variables or other intermediate information during execution of instructions to be executed by the processor 140.

One aspect of the present disclosure provides a probe apparatus. The probe apparatus includes a chuck configured to support a wafer, a track surrounding the chuck, and a tester disposed on the track and having a probe. The tester is configured to move around the wafer along a circumferential direction. The probe apparatus also includes a processing unit in communication with the tester and configured to control a movement of the tester.

Another aspect of the present disclosure provides a probe apparatus. The probe apparatus includes a chuck configured to support a wafer, a track surrounding the chuck, and a tester disposed on the track and having a probe. The probe apparatus also includes a processing unit in communication with the tester and configured to move the tester circumferentially around the wafer such that the probe is moved from a first portion on the wafer to a second portion on the wafer.

Another aspect of the present disclosure provides a wafer inspection method. The wafer inspection method includes: moving a probe of a tester along at least one direction with respect to a portion on a wafer and moving the tester circumferentially around the wafer such that the probe is moved from said portion on the wafer to next portion on the wafer.

By providing the track surrounding the chuck, the tester can be moved around the wafer along a circumferential direction through the track. The probe can be moved with respect to the wafer from many more directions than the current wafer prober, and the flexibility of the probe is increased. Therefore, the entire surface of the wafer can be inspected more quickly.

In addition, since the movement of the tester and/or the probe can be controlled by algorithms or computer-executable instructions, human error can be avoided or minimized.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A probe apparatus, comprising:
a chuck configured to support a wafer;
a track surrounding the chuck;
a tester disposed on the track and having a probe, wherein the tester includes a socket and a ball rotatably held by the socket; and
a processing unit in communication with the tester and configured to move the tester circumferentially around the wafer such that the probe is moved from a first portion on the wafer to a second portion on the wafer.

2. The probe apparatus of claim 1, wherein the processing unit is further configured to move the probe along at least one direction with respect to the wafer.

3. The probe apparatus of claim 1, wherein the probe is configured to be moved independently of the tester.

4. The probe apparatus of claim 3, wherein the processing unit is configured to move the probe and the tester concurrently.

5. The probe apparatus of claim 3, wherein the processing unit is configured to move the probe and the tester consecutively.

6. The probe apparatus of claim 1, wherein the chuck is configured to be moved along at least one direction such that the wafer is moved with respect to the probe.

7. The probe apparatus of claim 6, wherein the processing unit is configured to control a movement of the chuck.

8. A probe apparatus, comprising:
a chuck configured to support a wafer;
a track surrounding the chuck;
a tester disposed on the track and having a probe;
a processing unit in communication with the tester and configured to move the tester circumferentially around the wafer such that the probe is moved from a first portion on the wafer to a second portion on the wafer; and
a sensing unit configured to detect whether the tester is offset from a circumferential direction.

9. The probe apparatus of claim 8, wherein the sensing unit is further configured to measure an offset direction of the tester with respect to the circumferential direction.

10. The probe apparatus of claim 9, wherein the processing unit is further configured to adjust the movement of the tester based on the offset direction.

11. A wafer inspection method, comprising:
moving a probe of a tester along at least one direction with respect to a portion on a wafer;
moving the tester circumferentially around the wafer such that the probe is moved from the portion on the wafer to a next portion on the wafer; and detecting whether the tester is offset from a circumferential direction.

12. The wafer inspection method of claim 11, wherein the probe is configured to be moved independently of the tester and the wafer inspection method further comprises:
   moving the probe and the tester concurrently.

13. The wafer inspection method of claim 11, further comprising:
   measuring an offset direction with respect to the circumferential direction.

14. The wafer inspection method of claim 13, further comprising:
   adjusting a movement of the tester based on the offset direction.

15. The wafer inspection method of claim 14, further comprising:
   repeating moving the probe along at least one direction with respect to a portion on the wafer and moving the tester circumferentially around the wafer such that the probe is moved from the portion to a next portion on the wafer until all of predetermined portions on the wafer are inspected.

16. The wafer inspection method of claim 11, further comprising:
   moving the tester along a radial direction such that the probe is moved to a central portion.

* * * * *